United States Patent [19]

Carter

[11] Patent Number: 5,074,798

[45] Date of Patent: Dec. 24, 1991

[54] MODULAR SOCKET FOR AN INTEGRATED CIRCUIT

[75] Inventor: Clyde T. Carter, Shermans Dale, Pa.

[73] Assignee: Wells Electronics, Inc., South Bend, Ind.

[21] Appl. No.: 426,302

[22] Filed: Oct. 24, 1989

[51] Int. Cl.$^5$ .............................................. H01R 9/09
[52] U.S. Cl. ...................................... 439/72; 439/331
[58] Field of Search .................... 439/68, 69, 70, 71, 439/72, 66, 525, 526, 331, 591

[56] References Cited

U.S. PATENT DOCUMENTS

| | | | |
|---|---|---|---|
| 4,435,724 | 3/1984 | Ralstin | 439/526 X |
| 4,593,961 | 6/1986 | Cosmo | 439/66 |
| 4,699,593 | 10/1987 | Grabbe et al. | 439/66 X |
| 4,706,161 | 11/1987 | Buckingham | 439/72 |
| 4,921,430 | 5/1990 | Matsuoka | 439/72 |

Primary Examiner—Neil Abrams
Assistant Examiner—Khiem Nguyen
Attorney, Agent, or Firm—James D. Hall

[57] ABSTRACT

A modular socket for an integrated circuit package, wherein a single base is adapted to receive a plurality of replaceable contact modules having a variety of conductive lead counts. The modularity permits tooling of a single base to accommodate a variety of integrated circuit packages.

The socket includes a lid pivotally connected to the base by a hinge and hinge pin. The hinge pin defines a pivot axis which is in a plane with the bottom surface of the lid to limit lateral movement on the contacts carried by the module.

7 Claims, 2 Drawing Sheets

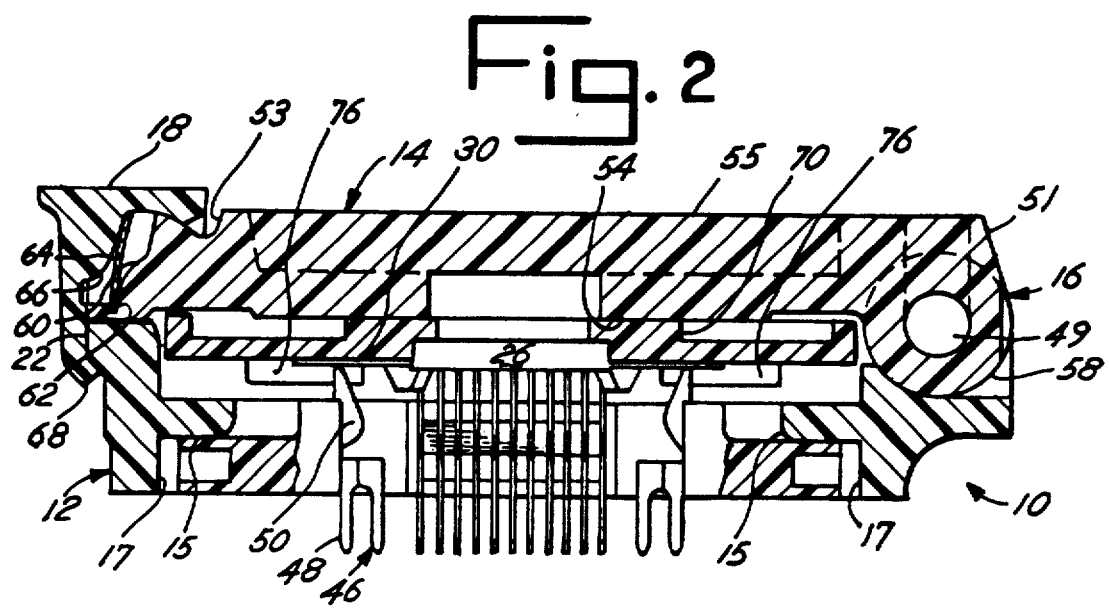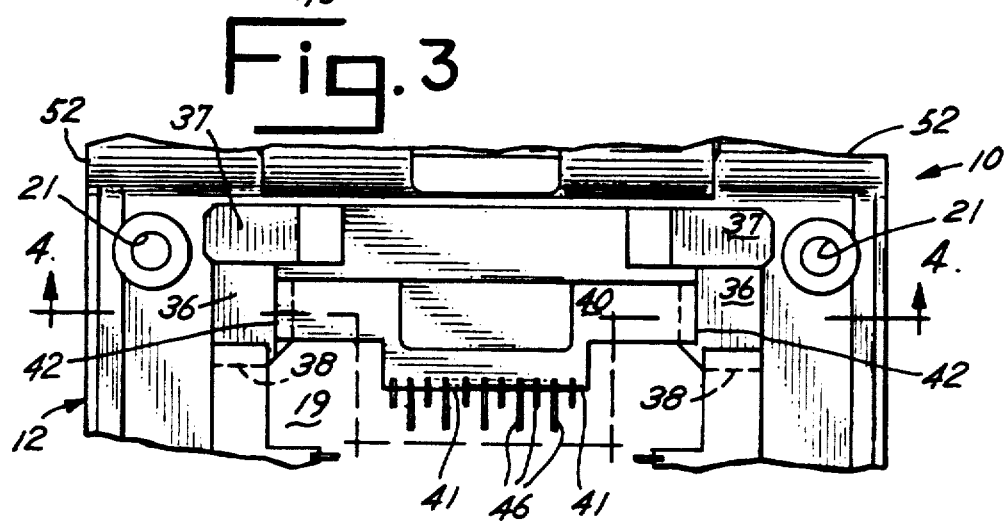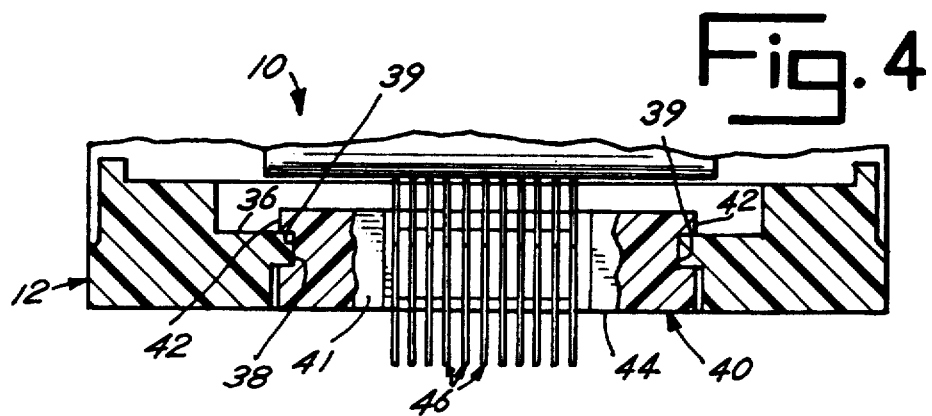

MODULAR SOCKET FOR AN INTEGRATED CIRCUIT

BACKGROUND OF THE INVENTION

This invention relates to socket devices used for mounting integrated circuit (IC) packages and more particularly to a modular socket device for accommodating a variety of IC package lead counts.

The term integrated circuit package refers to an integrated circuit (IC) chip that has been encapsulated in protective material such as plastic or ceramic. Although these packages may be either leaded or leadless, the present invention is illustrated in use with a leaded chip. It is common for the IC package to have from 4 to 164 leads. Typically a socket is used to temporarily mount an IC package for burn-in or similar testing purposes as well as in production or commercial uses when applied to a printed circuit board. A great number of designs exist and numerous patents have issued on the structure of the socket devices.

Heretofore, to accommodate the wide range of conductive lead counts from various IC packages, a user would need to have a number of sockets each constructed to carry an IC package with a specific lead count. Further, the manufacturer is required to supply the variety of sockets needed and to design new sockets each time an IC with a new lead count is produced.

BRIEF SUMMARY OF THE INVENTION

This invention eliminates the problems experienced with previous socket designs by providing a socket having a common frame or base carrying a plurality of contact modules. The modules are interchangeable and may be manufactured to carry a wide range of contact counts. Due to this modularity, a single base can accommodate a number of IC packages with various lead counts and therefore permit a manufacturer to produce a single type of base and lid combination to accommodate any number of IC leads packages. This reduces cost to both the manufacture and the end user.

In this invention, the top or lid is pivotally connected by a hinge to the base to urge the IC package into engagement with the contacts carried by the modules. The hinge is connected to the lid and base such that when the lid engages the IC package virtually all the force vectors on the package and its lead are normal to the leads. By limiting the lateral force applied to the contacts excessive wiping of the lead which could otherwise cause damage to the delicate IC leads is prevented.

It is accordingly an object of this invention to provide an improved socket for use with integrated circuit packages.

Another object of this invention is to provide a socket having replaceable contact modules to accommodate a wide variety of IC packages having a variety of lead counts.

Still another object of this invention is to provide a socket for an IC package wherein the IC package leads engage the socket contacts with limited side or lateral movement.

Other objects of the invention will become apparent upon a reading of the following description taken with the accompanying drawings.

BRIEF DESCRIPTION OF THE DRAWINGS

For the purpose of illustrating the invention, a preferred embodiment has been chosen, it being understood that this invention is not limited to the precise arrangement depicted, wherein:

FIG. 2 is a cross-sectional view of the socket device in the closed position with an IC chip carried therein.

FIG. 3 is a fragmentary top view of the base and one contact module.

FIG. 4 is a fragmentary sectional view taken along lines 4—4 of FIG. 3.

DETAILED DESCRIPTION OF THE INVENTION

Figure 1:
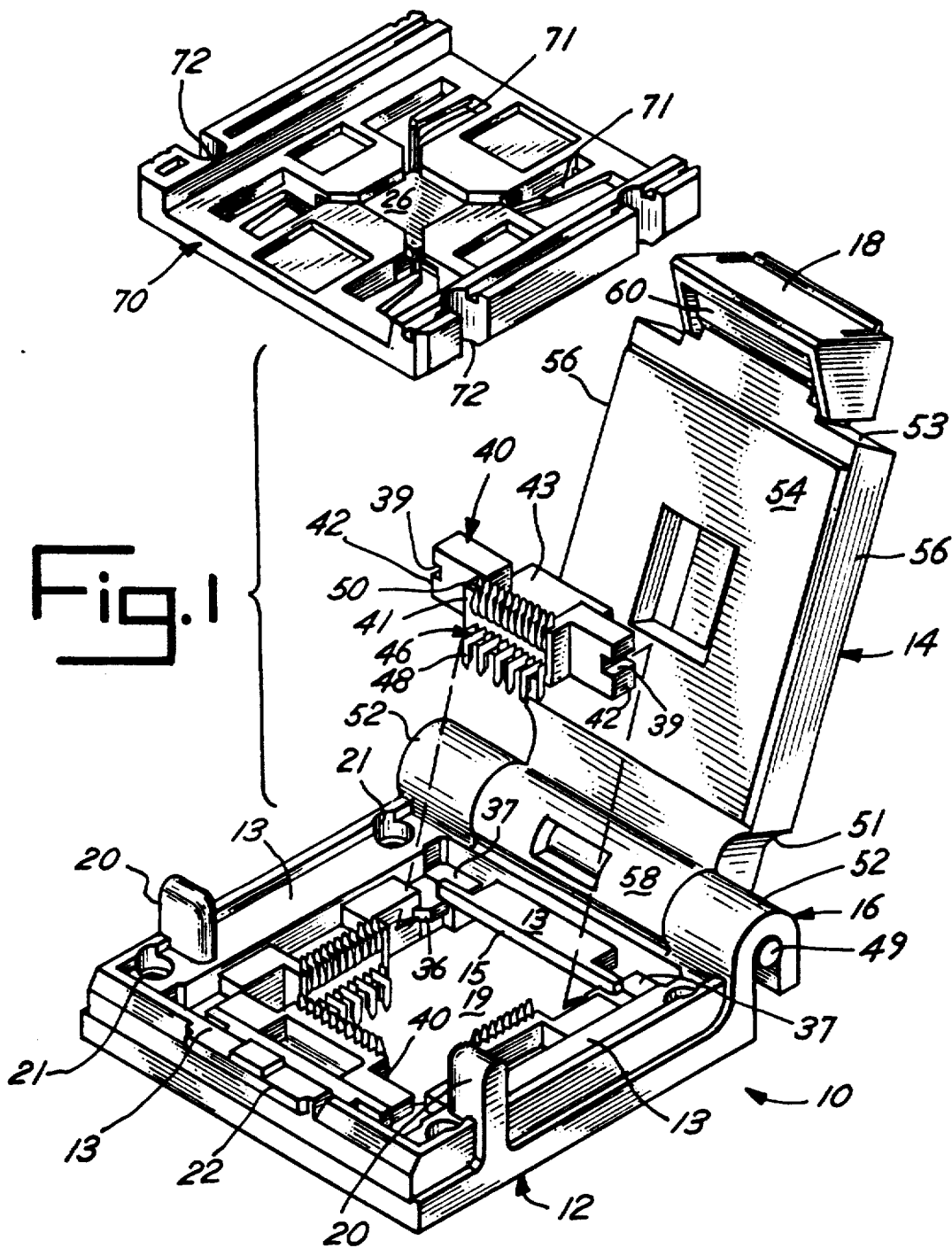
FIG. 1 is an exploded perspective view of the socket.

The preferred embodiment herein described is not intended to be exhaustive or to limit the invention to the precise form disclosed. It is chosen and described merely to explain the principles of the invention and its application and practical use to enable others skilled in the art to utilize the invention.

Referring now to the figures, socket 10 includes a base 12 and lid 14 which is pivotally connected to the base by a hinge 16. An IC package 70 which includes an IC and carrier is positioned between base 12 and lid 14. Lid 14 includes a pivotal latch 18 to secure lid 14 to base 12.

As illustrated, base 12 includes four sides 13 which define a center opening 19. Each side 13 includes an inwardly projecting ledge 15 which defines a recess or cavity 17 therebelow. (See FIGS. 1 and 2) Supports 36 are located at each corner of base 12 and extend into opening 19. All four supports 36 are identical and only one will be described in detail. As best illustrated in FIGS. 3 and 4, support 36 is molded integrally with base 12. Each support 36 includes a shelf 38 which extends into central opening 19 along each interior side of support 36. A recess 37 is formed in base 12 adjacent each support 36. Base 12 further includes two hinge knuckles 52 integrally formed along one side of the base and a ledge 22 extending outwardly from an opposite side 13 as illustrated. A pair of guide posts 20 extend upwardly from opposite side walls 13 of the base as illustrated in FIG. 1. A throughbore 21 is formed through base 12 at each corner to accommodate a mounting screw (not shown) to secure the base to a support surface such as a printed circuit board (not shown).

Lid 14 in the preferred embodiment is generally rectangular in shape and has ends 51, 53 and sides 56 which define inner surface 54 and outer surface 55. An integral hinge knuckle 58 extends from end 51 and pivotal latch 18 is connected to end 53 as described below. A hinge pin 49 extends through knuckles 52, 58 to pivotally connect lid 14 to base 12 and permit lid 14 to be pivoted between the open position of FIG. 1 and the closed position of FIG. 2. As illustrated best in FIGS. 1 and 2, a protrusion 60 extends outwardly from 53 to lid 14. A notch 62 is formed in protrusion 60 to restrictively accommodate one edge of a spring 64 therein. Latch 18 is pivotally connected to protrusion 60 by molded pivot pins (not shown) accommodated within bores (not shown) in protrusion 60 as is common in the industry. Latch 18 defines interior surface 66 illustrated in FIG. 2. Spring 64 contacts surface 66 to urge latch 18 downwardly about its pivot pins into a normally locked position. Latch 18 includes an inturned lip 68 which cams over and engages protrusion 60 of base 12 to secure lid 14 in the closed position of FIG. 2.

As previously explained in brief terms, four contact modules 40 are carried by base 12. Each module 40 is identical in shape and operation, accordingly, only one will be described in detail. Each contact module 40 includes an inner surface 41 and longitudinal ends 42. Each end 42 of contact module 40 has a slot 39 to accommodate a ledge 38 of a support 36. Slots 39 are located such that the bottom edge 44 of contact module 40 is flush with the bottom surface of base 12 when carried by the base. Each module includes a ledge 43 extending away from inner surface 41 as illustrated in FIG. 1. When the module is connected to base 12, ledge 43 of the module is accommodated within side wall cavity 17.

Each module 40 includes a plurality of parallel vertical slots (not shown) extending from inner surface 41 and into the interior of ledge 43 for accommodating a plurality of spring contacts 46 as is common in the industry. Contacts 46 as is common in the industry each include an upper head 50 for contacting the IC lead and a lower lead 48. Head 50 and lead 48 are integral parts of each contact and are interconnected by a body (not shown) such that head 50 springs away from the body and lead 48. Contacts 46 are carried by module 40 in a preloaded orientation; in other words, head 50 is urged toward lead 48 a small amount.

A non-conductive carrier 70 is included to hold the IC package. Carrier 70 is shaped to substantially conform to base 12 and includes a pair of opposed notches 72 and four downwardly extending posts (not shown). Notches 72 accommodate base guide post 20 and carrier posts (not shown) are accommodate within base recesses 37 to provide primary alignment of the carrier and IC package relative to contacts 46. Carrier 70 further includes a plurality of dividers 76 to electrically isolate and mechanically support the fragile leads of the IC package. Dividers 76 further serve as secondary alignment devices to ensure proper orientation of the package leads 30 to their respective contacts 46. Four flexible arms 71 removably secure IC package 26 to the carrier. Connector 70 is of similar construction to the connector shown in U.S. Pat. No. 4,485,724, incorporated herein by reference.

When all four contact modules 40 are inserted into base 12, IC package 26 is inserted into chip carrier 70, which is in turn placed on base 12. At this time, leads 30 of IC package 26 are in loose corresponding juxtaposition with upper heads 50 of contacts 46. To secure carrier 70 and IC package 26 and ensure a good electrical connection between leads 30 and contacts 46, lid 14 is pivoted into the closed position of FIG. 2. Latch 18 engages ledge 60 and cams over the protrusion. Lip 68 engages ledge 60 to lock the socket 10 into its closed position.

With base 12 level and carrier 70 loosely placed on base 12, the top of chip carrier 70 is slightly higher than a horizontal plane extending through radial center or pivot axis of hinge pin 49. As lid 14 is lowered, inner surface 54 contacts the upper surface of chip carrier 70. At this point, due to the orientation of hinge 16 further downward movement of lid 14 and its associated moments upon the carrier and package is essentially perpendicular to the IC package thereby substantially limiting a lateral moment on the leads which would result in excessive sliding or wiping between the leads and their respective contacts causing damage to the leads of the IC package or to contacts 46.

It must be understood that the drawings depict the modules for use with a 4×11 or 44 lead IC and that the chip carrier shown is fabricated to receive a 4×11 or 44 lead IC package. By necessity, if a larger or smaller IC were used the chip carrier the contact modules would only be replaced with appropriately sized modules and inserted into the same base 12.

An alternative embodiment of the invention could utilize an essentially H-shaped base for accommodating an IC package having leads on only two opposing sides. In such a construction the modules would be carried between the vertical legs of the H-shaped base with a hinge positioned along one vertical leg. Again the modules would be replaceable to accommodate a variety of IC package sizes and lead counts.

It should also be understood that this invention may be used with leaded or leadless chips without conceptual departure, and also finds application with other type of integrated circuit art such as tab bonding upon appropriate carrier modification.

It is to be understood that the invention is not to be limited to the precise form disclosed in this embodiment but may be modified without departing from the scope of the invention as defined by the appended claims.

What is claimed is:

1. A socket device for an integrated circuit package having a body and a plurality of conductive leads extending therefrom, said socket device comprising a base and a lid pivotally connected to said base and pivotal about a pivot axis between an open and closed position, said base including a central opening for accommodating said package body, said package being seated upon said base between said base and lid when said lid is in its closed position, and replaceable module means removably carried by said base about the periphery of said central opening for engaging said package conductive leads and electrically connecting each of said leads to a conductor, said replaceable module means constituting means for restricting said base central opening.

2. The socket of claim 1, wherein each said module means includes a plurality of electrically conductive contactors in alignment with each of said package conductive leads.

3. The socket of claim 2, wherein said base includes a plurality of guides, each module means being removably fitted between an adjacent pair of said guides.

4. The socket device of claim 1, where said pivotal connection between said base and lid includes knuckles carried by said base and lid interconnected by a hinge pin, said hinge pin defining a pivot axis, said lid having an inner surface, said pivot axis being in a plane with said lid inner surface to limit lateral movement of said conductive contactors relative to said housing as said lid is pivoted into its closed position.

5. A socket for an integrated circuit package, said package including a body having a plurality of conductive leads extending from said body, said socket including a base, said base including four side walls defining a framed interior opening, a module being removably carried by each side wall within said framed opening, each module including a housing having a front wall, wherein said front walls of said modules constitute means for restricting said framed interior opening of said base to accommodate said package body, each housing carrying a plurality of contactors for electrically connecting said conductive leads of said package to conductors, and a lid pivotally connected to one of said base side walls and shiftable between an open position and a closed position, said lid overlying said contacts carried by said modules in its said closed position.

6. The socket of claim 5 wherein said base includes a ledge extending into said framed opening from a junction of adjacent side walls, each module module including end walls, each end wall including a notch, a housing being carried on adjacent ledges by each said end wall notch slidably accommodating one of said ledges.

7. The socket of claim 6 wherein each base side wall includes a recess between adjacent pairs of said ledges, each housing includes a protrusion extending away from said front wall, said protrusion being frictionally accommodated within said side wall recess.

* * * * *